United States Patent
Yoo et al.

(10) Patent No.: US 12,408,262 B2
(45) Date of Patent: Sep. 2, 2025

(54) CIRCUIT BOARD AND METHOD FOR MANUFACTURING SAME

(71) Applicant: LG INNOTEK CO., LTD., Seoul (KR)

(72) Inventors: Do Hyuk Yoo, Seoul (KR); Seul Gi Lee, Seoul (KR); Du Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 268 days.

(21) Appl. No.: 18/039,454

(22) PCT Filed: Nov. 26, 2021

(86) PCT No.: PCT/KR2021/017661
§ 371 (c)(1),
(2) Date: May 30, 2023

(87) PCT Pub. No.: WO2022/114859
PCT Pub. Date: Jun. 2, 2022

(65) Prior Publication Data
US 2024/0098884 A1 Mar. 21, 2024

(30) Foreign Application Priority Data
Nov. 27, 2020 (KR) .................. 10-2020-0162806

(51) Int. Cl.
H05K 1/02 (2006.01)
H05K 3/00 (2006.01)
H05K 3/38 (2006.01)
H05K 3/42 (2006.01)

(52) U.S. Cl.
CPC ......... *H05K 1/0242* (2013.01); *H05K 3/0055* (2013.01); *H05K 3/381* (2013.01); *H05K 3/0035* (2013.01); *H05K 3/425* (2013.01); *H05K 2203/072* (2013.01); *H05K 2203/0723* (2013.01)

(58) Field of Classification Search
CPC .................................................. H05K 1/0242
USPC ........................................................ 174/258
See application file for complete search history.

(56) References Cited

U.S. PATENT DOCUMENTS

| | | | |
|---|---|---|---|
| 2009/0288870 A1* | 11/2009 | Kondo | H01L 21/4846 205/125 |
| 2015/0021084 A1* | 1/2015 | Ko | H05K 1/09 174/262 |
| 2015/0351251 A1 | 12/2015 | Hirose et al. | |
| 2018/0153043 A1 | 5/2018 | Kim et al. | |

FOREIGN PATENT DOCUMENTS

| | | |
|---|---|---|
| JP | 2010-10639 A | 1/2010 |
| KR | 10-2015-0009361 A | 1/2015 |
| KR | 10-1748054 B1 | 6/2017 |

(Continued)

*Primary Examiner* — Stanley Tso
(74) *Attorney, Agent, or Firm* — Birch, Stewart, Kolasch & Birch, LLP (57) ABSTRACT

A circuit board according to an embodiment includes an insulating layer; and a via formed in the insulating layer; wherein a width of an upper surface of the via is greater than a width of a lower surface of the via, and wherein the width of the lower surface of the via is 75% to 95% of the width of the upper surface of the via.

7 Claims, 9 Drawing Sheets

(56) References Cited

FOREIGN PATENT DOCUMENTS

| KR | 10-1841523 B1 | 3/2018 |
| KR | 10-2018-0060687 A | 6/2018 |
| KR | 10-2018-0123985 A | 11/2018 |
| KR | 10-20180123985 | * 11/2018 |

* cited by examiner

(a) Distribution of reoghness within 1mm*1mm region (b) Distribution of reoghness within 1mm*1mm region

CIRCUIT BOARD AND METHOD FOR MANUFACTURING SAME

CROSS REFERENCE TO RELATED APPLICATIONS

This application is the National Phase of PCT International Application No. PCT/KR2021/017661, filed on Nov. 26, 2021, which claims priority under 35 U.S.C. 119 (a) to Patent Application No. 10-2020-0162806, filed in the Republic of Korea on Nov. 27, 2020, all of which are hereby expressly incorporated by reference into the present application.

TECHNICAL FIELD

An embodiment relates to a circuit board and a method for manufacturing same.

BACKGROUND ART

Electronic components are being miniaturized, lightweight, and integrated, and accordingly, a line width of circuit is miniaturized. In particular, design rules of semiconductor chips are being integrated on a nanometer scale, and accordingly, a circuit line width of a package substrate or a circuit board on which semiconductor chips are mounted is miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

Meanwhile, such a circuit board includes a via. The via may be formed by forming a via hole in an insulating layer and plating a chemical copper plating layer on a surface of the insulating layer and an inner wall of the via hole. In this case, in general, a desmear process is performed to increase adhesion between the chemical copper plating layer and the insulating layer after the formation of the via hole. The desmear process imparts roughness to the surface of the insulating layer to improve adhesion between the insulating layer and the chemical copper plating layer.

However, according to the conventional circuit board, the via hole is expanded in the desmear process, and thus it is difficult to form a fine via.

Accordingly, there is a demand for a new method of manufacturing a circuit board capable of forming fine vias.

DISCLOSURE

Technical Problem

The embodiment provides a circuit board with a novel structure and a method for manufacturing the same.

In addition, the embodiment provides a circuit board including fine vias and a method for manufacturing the same.

In addition, the embodiment provides a circuit board capable of minimizing a difference between an upper width and a lower width of the via and a method for manufacturing the same.

In addition, the embodiment provides a circuit board capable of minimizing the variation in surface roughness according to the position of the insulating layer and a method for manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises an insulating layer; and a via formed in the insulating layer; wherein a width of an upper surface of the via is greater than a width of a lower surface of the via, and wherein the width of the lower surface of the via is 75% to 95% of the width of the upper surface of the via.

In addition, the width of the lower surface of the via is 80% to 90% of the width of the upper surface of the via.

In addition, a surface of the insulating layer has a surface roughness (Ra) in a range of 110 nm to 190 nm.

In addition, a deviation of the surface roughness (Ra) within a 1 mm*1 mm region of the insulating layer is 50 nm or less.

In addition, a side surface of the via has a surface roughness (Ra) in a range of 120 nm to 200 nm.

In addition, the insulating layer includes ABF (Ajinomoto Build-up Film).

A method for manufacturing a circuit board according to an embodiment comprises preparing an insulating layer in a B-stage state; imparting a surface roughness (Ra) to an upper surface of the insulating layer by laminating a metal layer on the upper surface of the insulating layer; removing the metal layer; curing the insulating layer in a C-stage state; forming a via hole in the insulating layer; desmearing the upper surface of the insulating layer and an inner wall of the via hole; and forming a via filling the via hole.

In addition, a width of an upper surface of the via is greater than a width of a lower surface of the via, and wherein the width of the lower surface of the via is 75% to 95% of the width of the upper surface of the via.

In addition, the width of the lower surface of the via is 80% to 90% of the width of the upper surface of the via.

In addition, a surface of the insulating layer after the desmearing has a surface roughness (Ra) in a range of 110 nm to 190 nm.

In addition, a deviation of the surface roughness (Ra) within a 1 mm*1 mm region of the upper surface of the insulating layer after the desmearing is 50 nm or less.

In addition, an inner wall of the via hole after the desmearing has a surface roughness (Ra) in a range of 120 nm to 200 nm.

In addition, the insulating layer includes ABF (Ajinomoto Build-up Film).

Advantageous Effects

In the embodiment, a uniform surface roughness may be formed on the surface of the insulating layer. Specifically, in the embodiment, a metal layer is laminated on the surface of the insulating layer in a B-stage state, and the surface roughness is imparted to the surface of the insulating layer corresponding to the surface roughness formed on the surface of the metal layer. Accordingly, the embodiment can minimize a deviation in surface roughness formed on the surface of the insulating layer.

In addition, the embodiment may form a fine via hole and a via filling the via hole in the insulating layer. Specifically, the embodiment allows the via hole to be formed in the insulating layer in the C-stage state and allows desmear of the insulating layer in the C-stage state. Accordingly, the embodiment may refine a size of the via hole before the desmearing. In addition, the embodiment may minimize a difference in the size of the via hole after the desmearing compared to the size of the via hole before the desmearing, thereby forming a small diameter via hole.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, an embodiment of a present invention will be described in detail with reference to the accompanying drawings.

Before describing the present embodiment, a comparative example compared to the present embodiment will be described.

Figure 1:
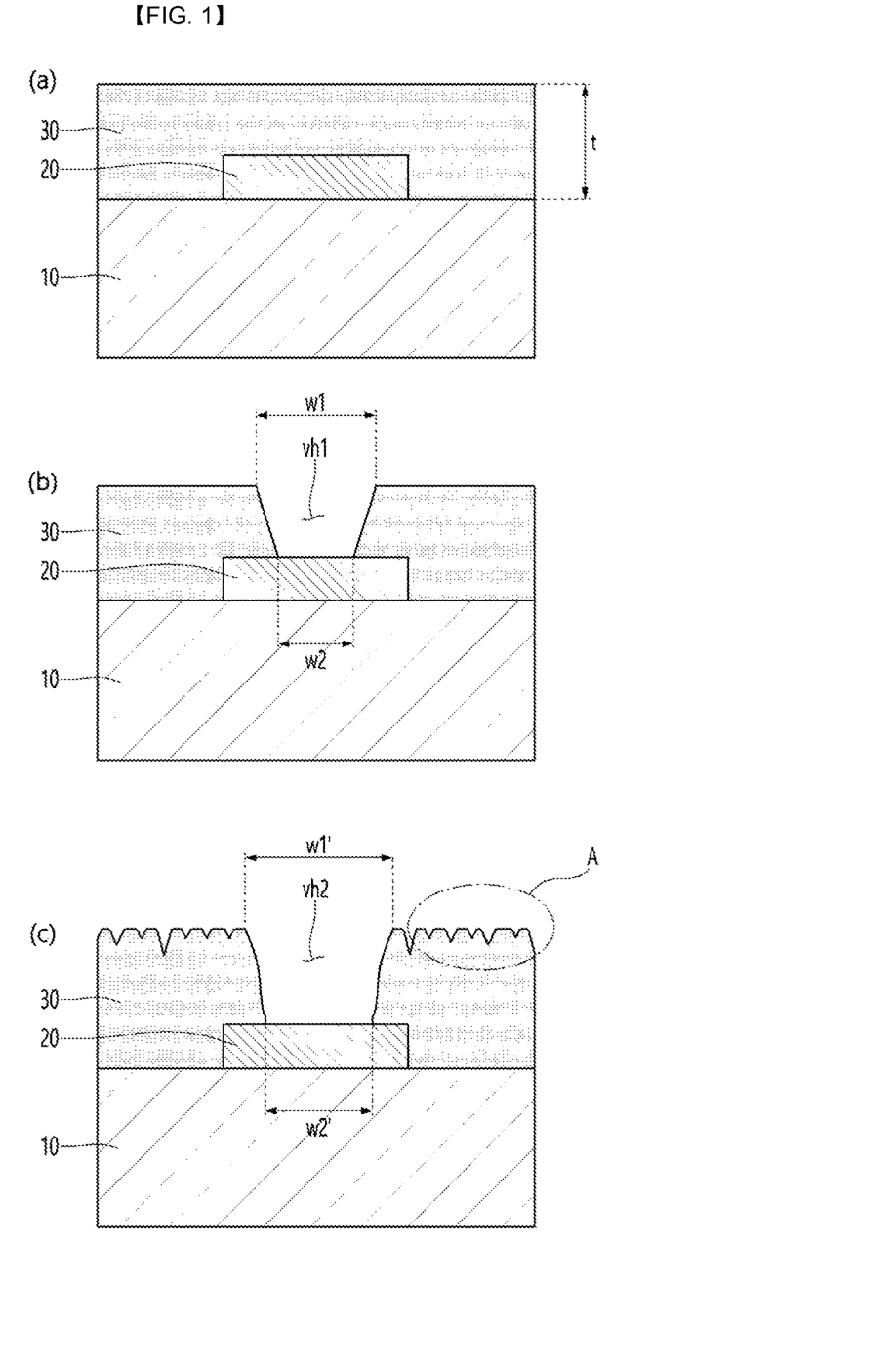
FIG. 1 is a view illustrating a method for manufacturing a circuit board according to a comparative example in order of process.
Figure 2:
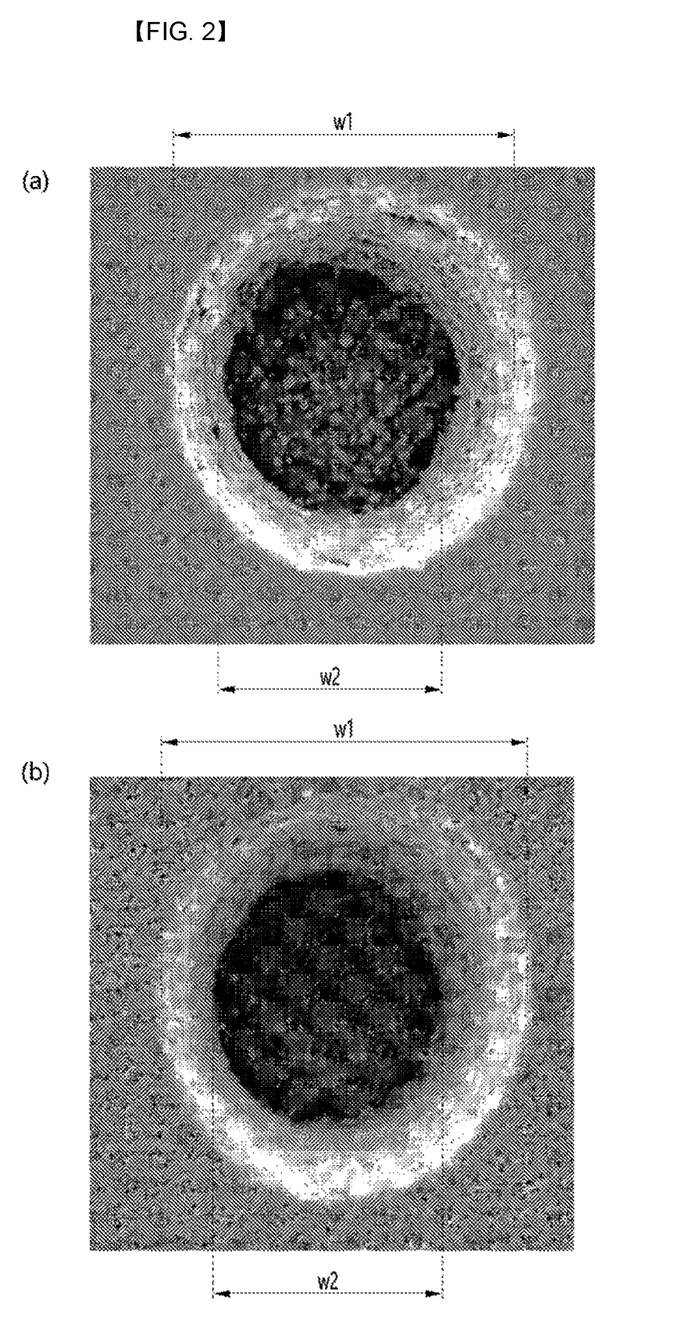
FIG. 2 is a plan view of the circuit board of FIG. 1.

FIG. 1 is a view illustrating a method for manufacturing a circuit board according to a comparative example in order of process, and FIG. 2 is a plan view of the circuit board of FIG. 1.

Referring to (a) of FIG. 1, the comparative example proceeds with a process of preparing a first insulating layer 10 and a process of forming a circuit pattern 20 on the upper surface of the first insulating layer 10. Then, when the circuit pattern 20 is formed, the comparative example proceeds with a process of laminating a second insulating layer 30 on the upper surface of the first insulating layer 10. In this case, the second insulating layer 30 is in a B-stage state. Specifically, the second insulating layer 30 is laminated on the upper surface of the first insulating layer 10 in a semi-cured state.

Then, referring to (b) of FIG. 1, the comparative example proceeds a process of forming a via hole vh1 in the second insulating layer 30. At this time, an upper width of the formed via hole vh1 is different from a lower width of the via hole. That is, an upper width of the via hole vh1 has the first width vh1, and a lower width of the via hole has a second width vh2 smaller the first width vh1. The via hole vh1 as described above is formed through a laser process.

Then, referring to (c) of FIG. 1, the comparative example proceeds a process of desmearing the second insulating layer 30. At this time, the desmear process of the comparative example is a wet desmear process. The desmear process is a process of imparting a certain level or more of roughness on a surface of the second insulating layer 30.

That is, when the via hole vh1 is formed in the manufacturing process of the circuit board, the desmear process is performed to impart a certain level of roughness to a surface of the second insulating layer 30 and an inner wall of the via hole vh1. The desmear process is performed to secure adhesion between the second insulating layer 30 and a chemical copper plating layer (not shown) formed on the surface of the second insulating layer 30 and the inner wall of the via hole vh1. Specifically, in order to secure the adhesion between the second insulating layer 30 and the chemical copper plating layer, Ra (average surface roughness) of 110 nm or more should be imparted on the second insulating layer 30.

Accordingly, when the via hole vh1 is formed during the manufacturing process of the circuit board, the comparative example performs the desmear process to impart roughness to the surface of the second insulating layer 30.

However, in the circuit board of the comparative example, a desmear process is performed after forming a via hole vh1 in the second insulating layer 30 in a B-stage state. Accordingly, in the comparative example, a size of the via hole vh1 is changed during the desmear process.

For example, as shown in FIG. 2, a size of the via hole vh2 after the desmear process is completed is greater than a size of the via hole vh1 before the desmear process. That is, when the desmear process is completed, the upper width of the via hole vh2 has a third width w1', and the lower width has a fourth width w2'. In this case, the third width w1' is greater than the first width w1', and the fourth width w2' is greater than the second width w2. In other words, in the comparative example, the desmear process is performed on the second insulating layer 30 in the B-stage state, the inner wall of the via hole is also etched during the desmear process, and thus the size of the via hole is expanded. Accordingly, the comparative example has a problem in that it is difficult to miniaturize the size of the via hole and further the size of the via.

For example, a minimum size of the via hole is determined based on a thickness t of the second insulating layer 30. That is, there is a limit to reducing the size of the via hole according to the thickness t of the second insulating layer 30. In addition, in a state where the minimum size of the via hole is determined as described above, the size of the via hole is expanded in the desmear process. That is, a difference between the third width w1' of the via hole vh2 after the desmear process and the first width w1 of the via hole vh1 before the desmear process is about 10 μm to 15 μm.

Therefore, the comparative example has a problem in that it is difficult to refine the via due to the size expansion of the via hole as described above, and thus it is difficult to implement a small-diameter product.

Accordingly, the embodiment provides a method for manufacturing a new circuit board that solves the size expansion problem of the via hole of the comparative example and a circuit board manufactured thereby.

Figure 3:
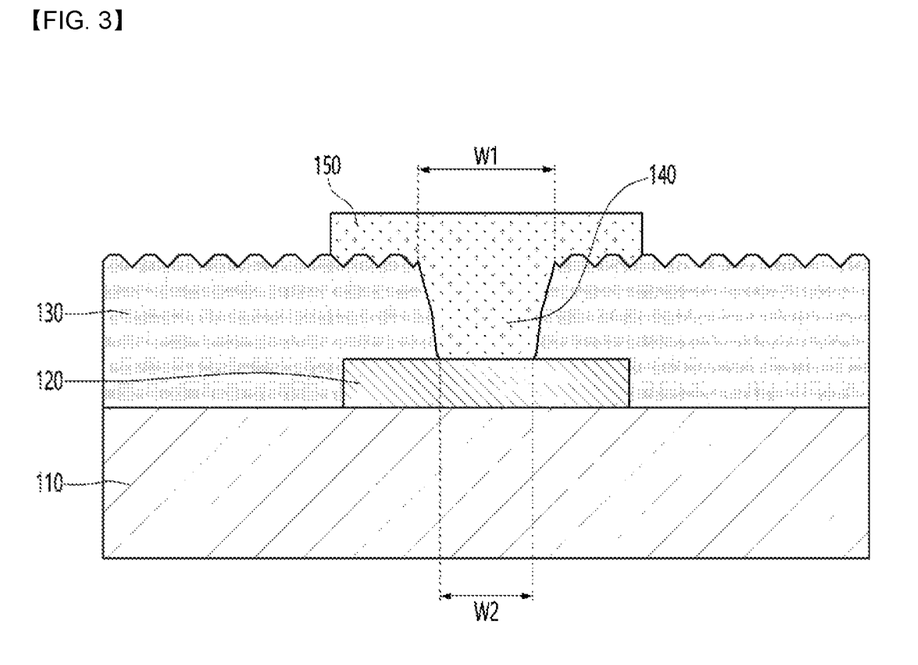
FIG. 3 is a view illustrating a circuit board according to an embodiment.
Figure 8:
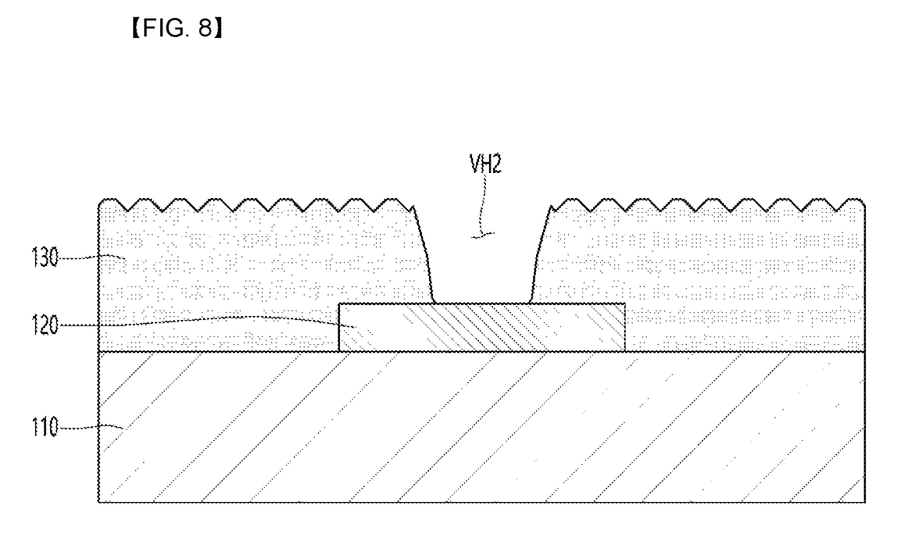
Figure 9:
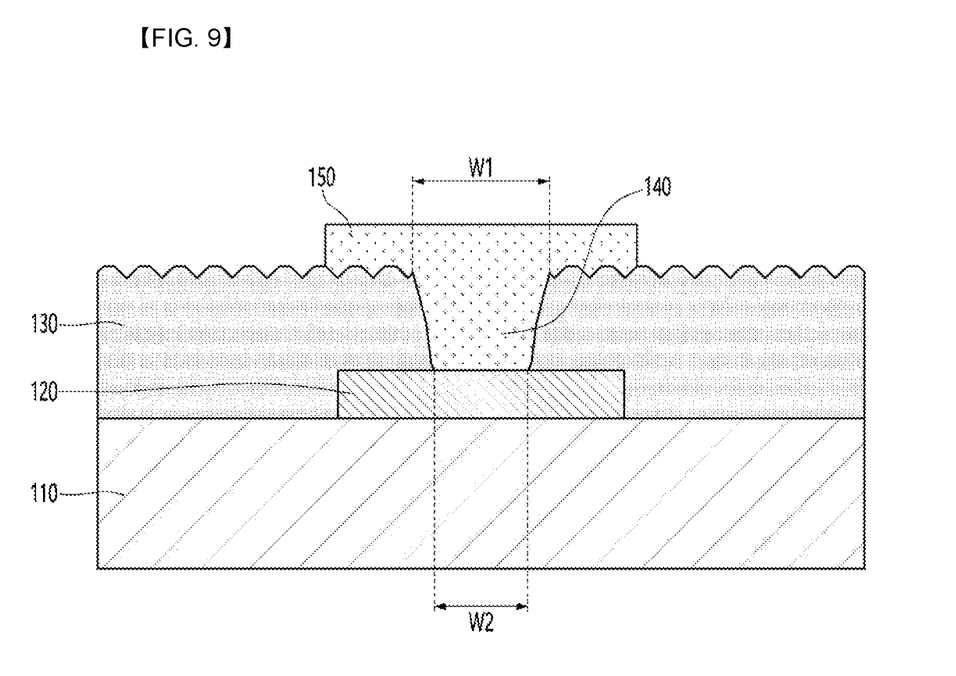
Figure 10:
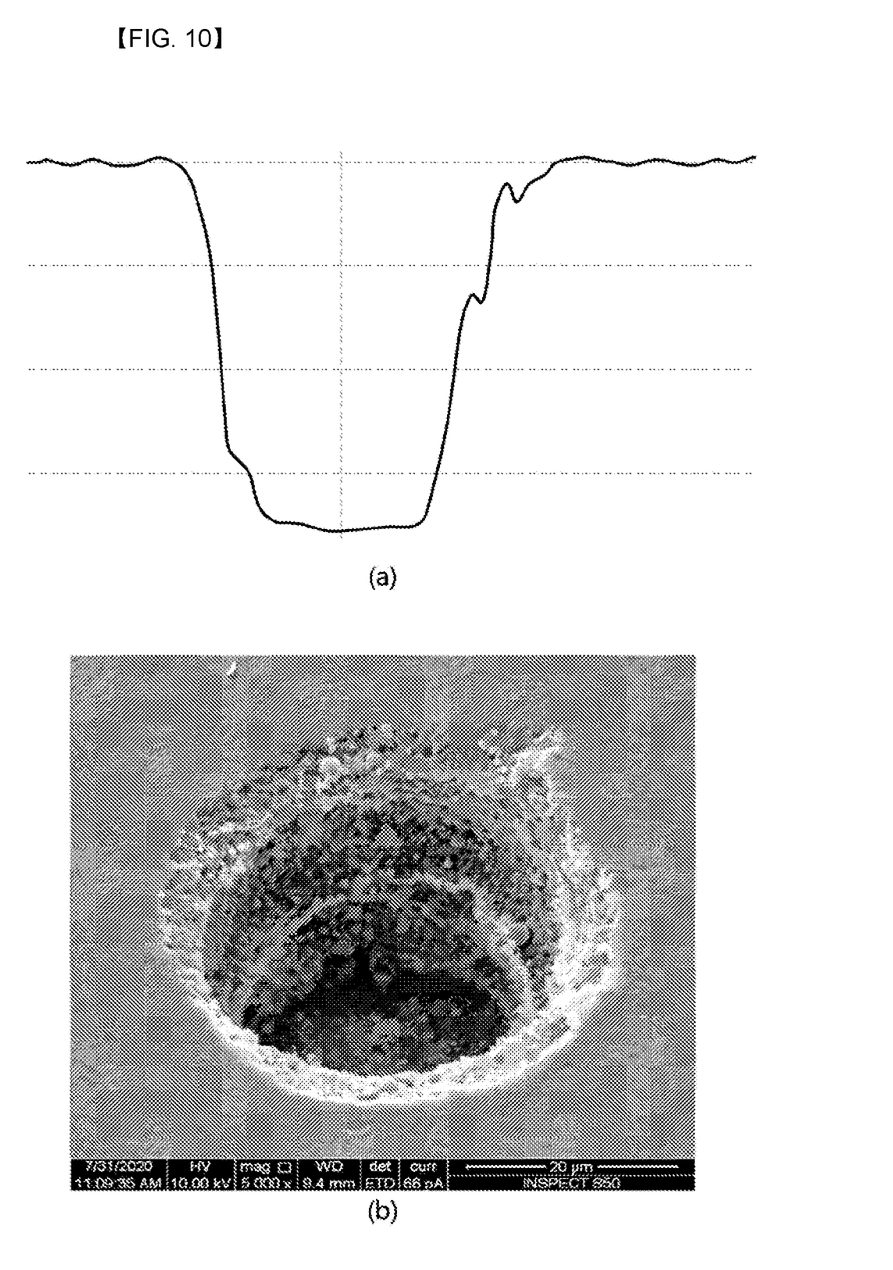
FIG. 10 is a view for explaining deviations in surface roughness of insulating layers of an embodiment and a comparative example.
Figure 11:
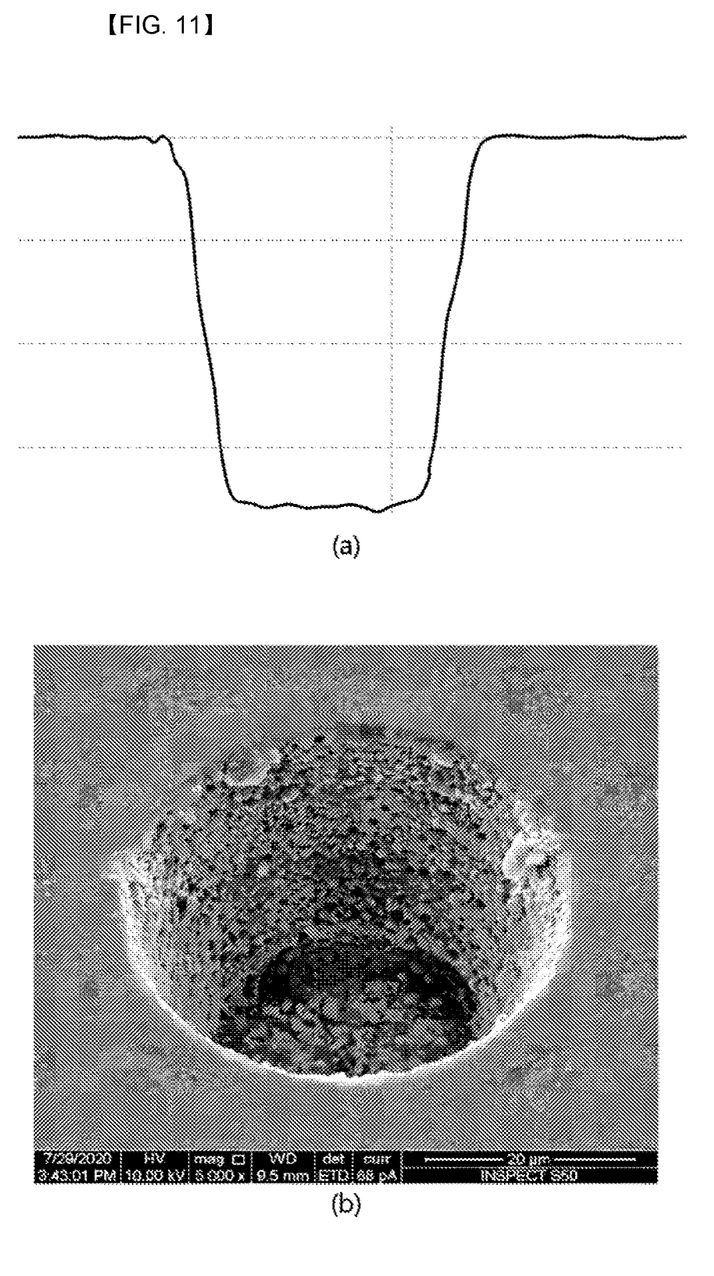
FIG. 11 is a view for explaining surface roughness of an inner wall of a via hole according to a comparative example.
Figure 12:
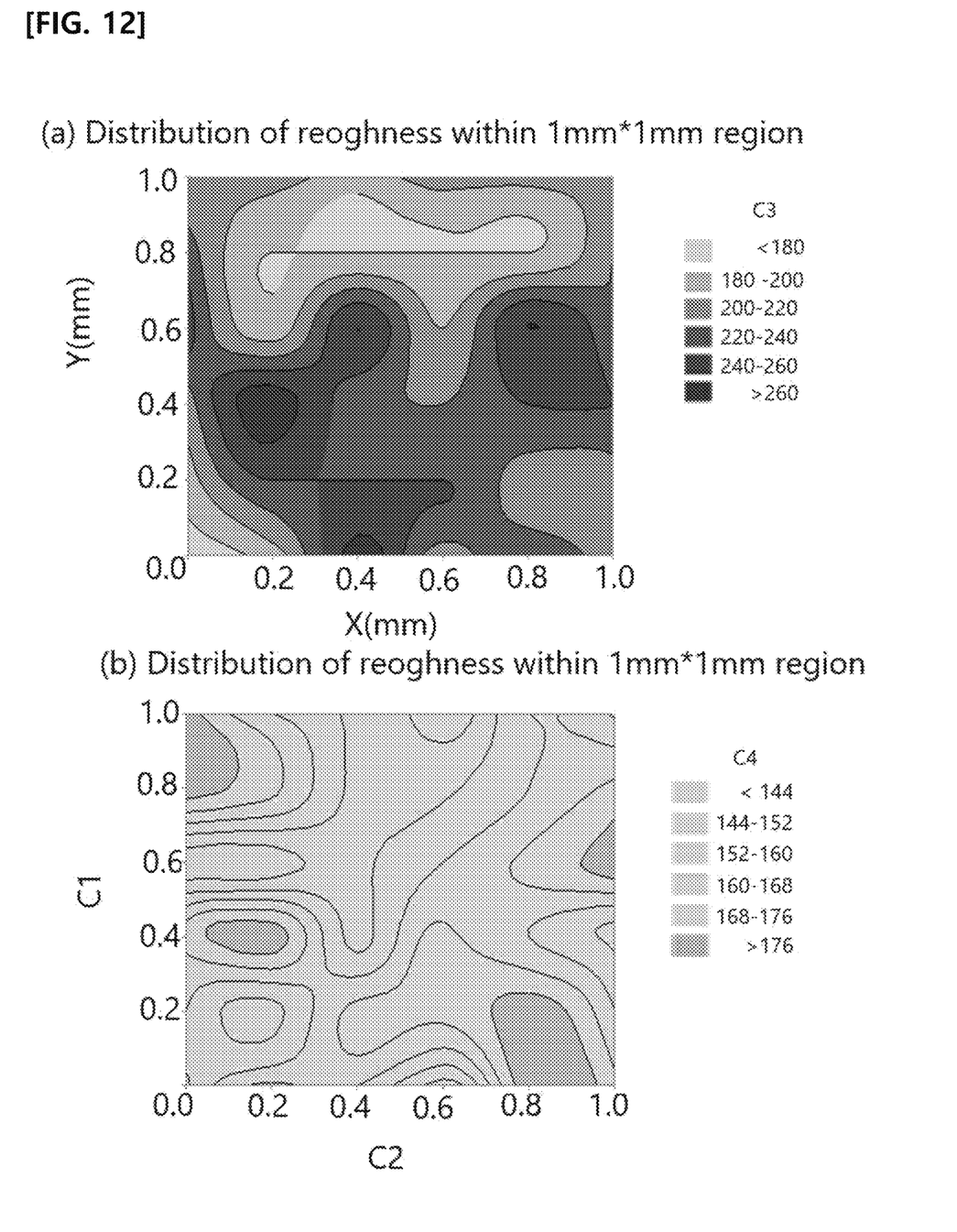
FIG. 12 is a view for explaining surface roughness of an inner wall of a via hole according to an embodiment.

FIG. 3 is a view illustrating a circuit board according to an embodiment, FIGS. 4 to 9 are views illustrating a method for manufacturing a circuit board shown in FIG. 3 in order of process, FIG. 10 is a view for explaining deviations in surface roughness of insulating layers of an embodiment and a comparative example, FIG. 11 is a view for explaining surface roughness of an inner wall of a via hole according to a comparative example, and FIG. 12 is a view for explaining surface roughness of an inner wall of a via hole according to an embodiment.

Hereinafter, a method for manufacturing a circuit board and a circuit board manufactured thereby will be described in detail with reference to FIGS. 3 to 12.

First, referring to FIG. 3, the circuit board in the embodiment includes a first insulating layer 110, a circuit pattern 120, a second insulating layer 130 and a via 140.

The first insulating layer 110 may have a flat plate structure. The first insulating layer 110 may be a base member for manufacturing the circuit board of the embodiment. The first insulating layer 110 may be a prepreg containing glass fibers. For example, the first insulating layer 110 may include an epoxy resin and a glass fiber and a filler dispersed in the epoxy resin. For example, the first insulating layer 110 may be CCL (Copper Clad Laminate).

A circuit pattern 120 may be disposed on an upper surface of the first insulating layer 110. However, although the drawing shows that the circuit pattern 120 is disposed only on the upper surface of the first insulating layer 110, it is not limited thereto, and the circuit pattern 120 may be formed on the lower surface as well as the upper surface of the first insulating layer 110.

The circuit pattern 120 may be formed of at least one metal material selected from gold (Au), silver (Ag), platinum (Pt), titanium (Ti), tin (Sn), copper (Cu), and zinc (Zn).

In addition, the circuit pattern 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the circuit pattern 120 may be formed of copper (Cu) having high electrical conductivity and a relatively inexpensive price.

The circuit pattern 120 may be formed by an additive process, a subtractive process, a modified semi additive process (MSAP), and a semi additive process (SAP) process, which are typical circuit board manufacturing processes and a detailed description thereof will be omitted here.

A second insulating layer 130 may be disposed on the first insulating layer 110. The second insulating layer 130 may be in a fully cured state or an overcured state. For example, the second insulating layer 120 may include a C-stage resin.

The second insulating layer 130 is a material including an inorganic filler and an insulating resin, for example, a thermosetting resin such as epoxy resin, a thermoplastic resin such as polyimide, or a resin containing a reinforcing material such as an inorganic filler, specifically ABF (Ajinomoto Build-up Film), FR-4, BT (Bismaleimide Triazine), PID (Photo Imagable Dielectric Resin), and the like. Preferably, the second insulating layer 130 may include ABF.

An upper surface of the second insulating layer 130 may be provided with roughness. For example, Ra of the upper surface of the second insulating layer 130 may be 110 nm to 190 nm. For example, Ra of the second insulating layer 130 may be 130 nm to 170 nm.

In addition, a roughness deviation (maximum Ra−minimum Ra) for each position of the upper surface of the second insulating layer 130 may be 50 nm or less. That is, a uniform roughness Ra may be formed on the upper surface of the second insulating layer 130 according to an embodiment as compared with the comparative example.

A via hole (not shown) may be formed in the second insulating layer 130, and a via 140 may be formed to fill the formed via hole. In addition, a circuit pattern 150 may be formed on an upper surface of the second insulating layer 130.

The via 140 is formed passing through the second insulating layer 130. The via 140 may electrically connect the circuit pattern 120 disposed on the upper surface of the first insulating layer 110 and the circuit pattern 150 disposed on the upper surface of the second insulating layer 130.

A width W1 of an upper surface of the via 140 may be different from a width W2 of a lower surface of the via 140. Here, the width W1 of the upper surface of the via 140 may be a diameter of the upper surface of the via 140. For example, the width W1 of the upper surface of the via 140 may be a width of the upper surface of the via 140 in a first direction. The first direction may be a longitudinal direction or a width direction. Further, the width W2 of the lower surface of the via 140 may mean the width of the lower surface corresponding to the upper surface of the via 140.

The width W1 of the upper surface of the via 140 may be greater than the width W2 of the lower surface of the via 140.

The width W2 of the lower surface of the via 140 may be 75% to 95% of the width W1 of the upper surface of the via 140. For example, the width W2 of the lower surface of the via 140 may be 77% to 92% of the width W1 of the upper surface of the via 140. For example, the width W2 of the lower surface of the via 140 may be 80% to 90% of the width W1 of the upper surface of the via 140.

Meanwhile, a side surface of the via 140 may have Ra corresponding to an inner wall of a via hole formed in the second insulating layer 130. For example, the side surface of the via 140 may have Ra between 120 nm and 200 nm.

The via 140 and the circuit pattern 150 may include a plurality of layers. For example, each of the via 140 and the circuit pattern 150 may include a first plating layer (not shown) and a second plating layer (not shown). For example, a first via 140 may include a first plating layer formed on an inner wall of the via hole and a second plating layer disposed on the first plating layer. In addition, the circuit pattern 150 may include a first plating layer disposed on the upper surface of the second insulating layer 130 and a second plating layer disposed thereon. The first plating layer may be a chemical copper plating layer formed through electroless plating. In addition, the second plating layer may be an electrolytic plating layer formed by electroplating the first plating layer as a seed layer.

On the other hand, the structural characteristics of the circuit board as described above may be exhibited by a manufacturing method described below. Hereinafter, the structural characteristics of the circuit board as described above will be described in connection with the method for manufacturing the circuit board shown in FIGS. 4 to 9.

Figure 4:
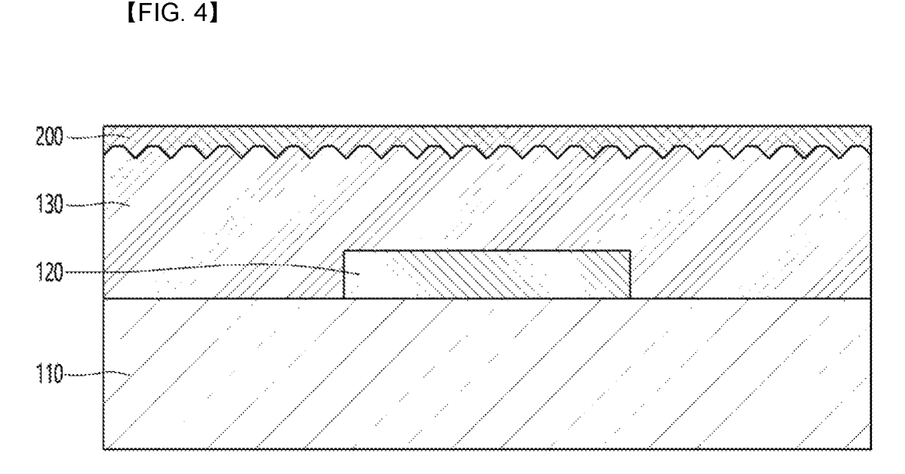
FIGS. 4 to 9 are views illustrating a method for manufacturing a circuit board shown in FIG. 3 in order of process.

Referring to FIG. 4, in the embodiment, a first insulating layer 110 may be prepared, and a circuit pattern 120 may be formed on at least one surface of the first insulating layer 110.

Thereafter, when the circuit pattern 120 is formed, the embodiment may proceed with a process of laminating the second insulating layer 130 covering the circuit pattern 120 on the upper surface of the first insulating layer 110. The second insulating layer 130 may be ABF, but is not limited thereto.

At this time, the second insulating layer 130 may have a first cured state. The first cured state may mean an A-stage state. The A-stage state may mean an uncured state. For example, the A-stage state may mean a state in which the resin is in an uncured state and is easy to melt and flow.

When the second insulating layer 130 in the first cured state is laminated on the first insulating layer 110, the embodiment may proceed with a process of curing the second insulating layer 130 in the second cured state. The second cured state may mean a B-stage state. The B-stage state may mean a semi-cured state. For example, the B-stage state may mean a soft semi-cured state as the resin is heated during the curing process.

Meanwhile, the embodiment is not limited thereto. For example, the second insulating layer 130 in a B-stage state may be formed on the first insulating layer 110 above, thereby omitting the process of curing the second insulating layer 130 of the A-stage state.

When the second insulating layer 130 is in a B-stage state corresponding to a semi-cured state, the embodiment may proceed with a process of laminating a metal layer 200 on the upper surface of the second insulating layer 130.

The metal layer 200 includes copper, and a surface roughness may be imparted to at least one surface. For example, at least one surface of the metal layer 200 may have Ra in a range of 60 nm to 100 nm. For example, at least one surface of the second insulating layer 130 may have Ra in a range of 70 nm to 90 nm.

For example, the lower surface of the metal layer 200 may have Ra ranging from 60 nm to 100 nm or from 70 nm to 90 nm.

In addition, the metal layer 200 may be attached to the upper surface of the second insulating layer 130 by being compressed in a state in which the lower surface of the metal layer faces the upper surface of the second insulating layer 130. At this time, the second insulating layer 130 is in a B-stage state. Accordingly, the surface roughness formed on the lower surface of the metal layer 200 may be directly applied on the upper surface of the second insulating layer 130.

Accordingly, the upper surface of the second insulating layer 130 may have Ra ranging from 60 nm to 100 nm or from 70 nm to 90 nm due to the metal layer 200.

As described above, the embodiment applies surface roughness on the upper surface of the second insulating layer 130 using the metal layer before applying surface roughness through the desmear process. Accordingly, the embodiment may impart a uniform surface roughness on the upper surface of the second insulating layer 130 in response to the surface roughness uniformly applied to the metal layer 200.

Figure 5:
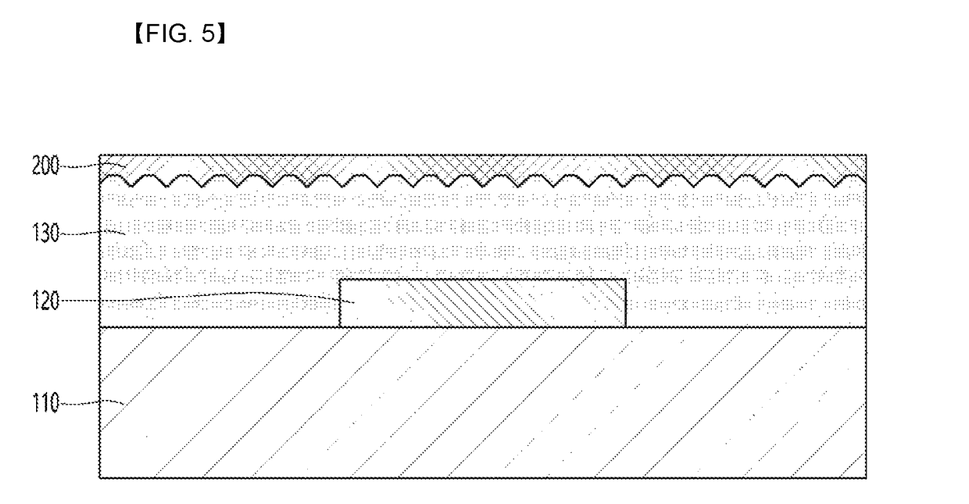

Next, referring to FIG. 5, the embodiment may proceed with a curing process of the second insulating layer 130 after the metal layer 200 is laminated. For example, when surface roughness is imparted to the upper surface of the second insulating layer 130 by the metal layer 200, the embodiment may proceed with a curing process so that the second insulating layer 130 is in a third cured state. The third cured state may mean a C-stage state. For example, the C-stage state may mean a fully cured state or an overcured state. Accordingly, the second insulating layer 130 in the embodiment may be fully cured or overcured in a state in which surface roughness is imparted by the metal layer 200.

Figure 6:
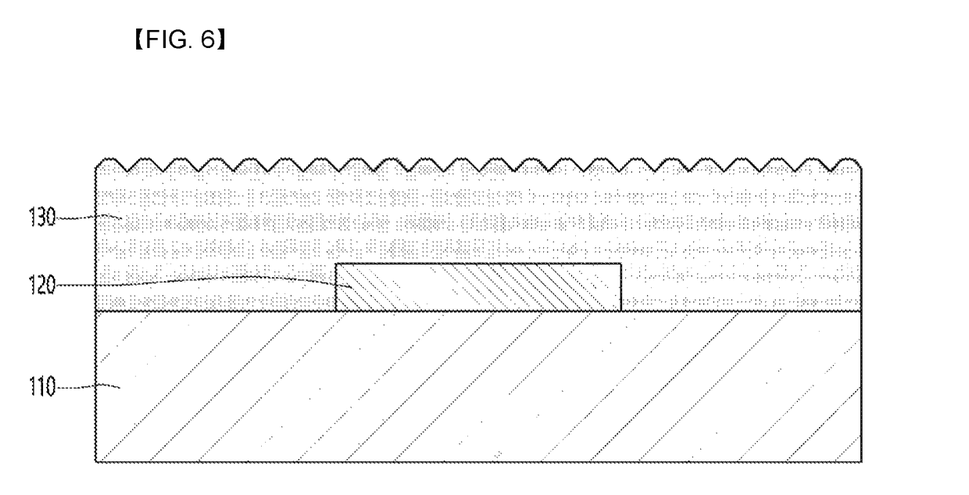

Next, referring to FIG. 6, when the second insulating layer 130 is in a C-stage state, the embodiment may proceed with a process of removing the metal layer 200 disposed on the upper surface of the second insulating layer 130. The process of removing the metal layer 200 may be performed using an etching agent capable of removing only a metal material corresponding to the metal layer 200 without damaging the second insulating layer 130.

When the metal layer 200 is removed as described above, the upper surface of the second insulating layer 130 may be exposed. In this case, the upper surface of the second insulating layer 130 may have Ra in a range of 60 nm to 100 nm or 70 nm to 90 nm, which is imparted by the metal layer 200 as described above.

Meanwhile, the embodiment may proceed by changing the order of the process of removing the metal layer and the process of curing the second insulating layer 130 in a C-stage state. For example, when Ra corresponding to the metal layer 200 is applied to the upper surface of the second insulating layer 130 after the metal layer 200 is laminated, the embodiment may preferentially proceed with the process of removing the metal layer 200. And, when the metal layer 200 is removed, the embodiment may proceed with a process of curing the second insulating layer 130 in a C-stage state.

Figure 7:
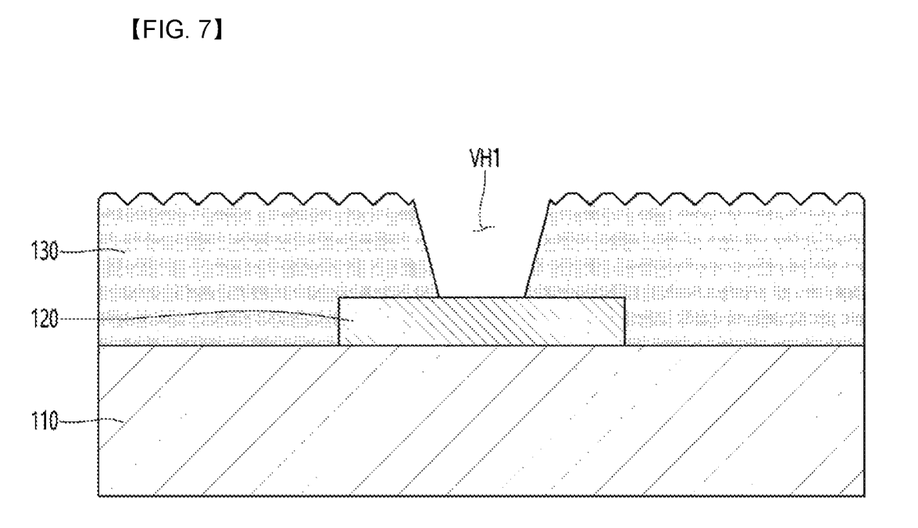

Next, referring to FIG. 7, the embodiment may proceed with a process of forming a via hole VH1 in the second insulating layer 130 in the c-stage state. The via hole VH1 may be formed by any one of mechanical, laser, and chemical processing. When the via hole VH1 is formed by mechanical processing, it may be formed using methods such as milling, drilling, and routing. When the via hole VH1 is formed by laser processing, it may be formed using a UV or $CO_2$ laser method. When the via hole VH1 is formed by chemical processing, it can be formed using chemicals containing amino silane, ketones, etc. Accordingly, the second insulating layer 130 may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and $CO_2$ laser is a laser that can process only insulating layers.

Meanwhile, the via hole VH1 formed in the second insulating layer 130 may expose the circuit pattern 120 disposed on the upper surface of the first insulating layer 110. For example, the via hole VH1 may be formed in a region overlapping the circuit pattern 120 in a vertical direction on the second insulating layer 130, and thus the upper surface of the circuit pattern 120 can expose. In this case, the via hole VH1 may have a first size. Also, an inner wall of the via hole VH1 may have a first surface roughness. This will be described in detail below.

Next, referring to FIG. 8, the embodiment may proceed with a process of desmearing the upper surface of the second insulating layer 130 and the inner wall of the via hole VH1. At this time, the second insulating layer 130 in the embodiment is in a C-stage state. Accordingly, it is possible to minimize changes in the surface roughness of the upper surface of the second insulating layer 130 and the surface roughness of the inner wall of the via hole VH1 in the above desmear process. Accordingly, the embodiment can minimize the degree of expansion of the via hole VH1 by the desmear process. For example, the embodiment may minimize the expansion of the via hole VH1 by the desmear process compared to the comparative example. Accordingly, in the embodiment, it is possible to miniaturize the via hole VH1.

For example, in the embodiment, the upper surface of the second insulating layer 130 and the inner wall of the via hole VH1 may be surface-treated through the desmear process. Accordingly, the surface roughness and size of the via hole VH2 after the desmearing are different from those of the via hole VH1 before the desmearing. In addition, the surface roughness of the upper surface of the second insulating layer 130 before the desmearing and the surface roughness after the desmearing may be different from each other. This will be described in more detail below.

Then, referring to FIG. 9, the embodiment may proceed with a process of forming a via 140 by filling the inside of the via hole (VH2) after the desmearing with a metal material and a process of forming the circuit pattern 150 protruding from the upper surface of the second insulating layer 130. The process of forming the via 140 and the circuit pattern 150 includes, as described above, a process of forming a chemical copper plating layer through electroless plating, a proceed of forming an electrolytic plating layer by electroplating the chemical copper plating layer as a seed layer, and a process of etching the chemical copper plating layer.

As described above, the embodiment imparts surface roughness on the upper surface of the second insulating layer 130 using the metal layer 200, and accordingly, it is possible to ensure uniformity of surface roughness of the second insulating layer 130. In addition, the embodiment can improve the size accuracy of the via hole by forming the via hole in the second insulating layer 130 in the C-stage state. In addition, the embodiment proceeds with the desmear process of the second insulating layer 130 in a C-stage state, and accordingly, it can minimize the expansion of the formed via hole.

Hereinafter, it will be described by comparing the circuit board formed by the above manufacturing process with the circuit board of the comparative example.

<Comparison of Via Hole Sizes>

The comparative example forms a via hole in the B-stage state and then proceeds with the desmear process. Unlike this, the embodiment imparts surface roughness to the insulating layer in the B-stage state before forming via holes, and forms a via hole in the C-stage state and then proceeds with the desmear process. Accordingly, the embodiment can reduce the size of the initially formed via hole compared to the comparative example, and further minimize the expansion of the size of the via hole after the desmearing.

Table 1 shows the size of the via hole after the desmearing according to the thickness of the insulating layer of the comparative example.

TABLE 1

| Comparative example | Thickness of the insulating layer | | |
|---|---|---|---|
| | 12.5 μm | 17.5 μm | 37.5 μm |
| Upper width of the via hole | 30 μm | 45 μm | 60 μm |
| Lower width of the via hole | 22 μm | 32 μm | 40 μm |
| Ratio of the thickness of the insulating layer to the upper width of the via hole | 41% | 38% | 63% |

Referring to Table 1, in the comparative example, when the thickness of the insulating layer was 12.5 μm, the upper width of the via hole was 30 μm. In addition, in the comparative example, the upper width of the via hole increased as the thickness of the insulating layer increased. Accordingly, in the comparative example, the minimum size of a formable via hole was about 30 µm based on the upper width of the via hole.

Table 2 shows the size of the via hole after the desmearing according to the thickness of the insulating layer of the embodiment.

TABLE 2

| Embodiment | Thickness of the insulating layer | | |
|---|---|---|---|
| | 12.5 µm | 17.5 µm | 37.5 µm |
| Upper width of the via hole | 20 µm | 30 µm | 45 µm |
| Lower width of the via hole | 16 µm | 24 µm | 36 µm |
| Ratio of the thickness of the insulating layer to the upper width of the via hole | 63% | 58% | 83% |

As in Table 2 above, in the embodiment, when the thickness of the insulating layer was 12.5 µm, the upper width of the via hole was 20 µm. Accordingly, in the embodiment, it was confirmed that the minimum size of a formable via hole was 20 µm based on the upper width of the via hole.

The difference in the size of the via hole in the above embodiment and the comparative example is due to whether the via hole formation and desmear process is performed in the B-stage state of the insulating layer or the via hole formation and desmear process in the C-stage state.

<Comparison of Degree of Expansion of Via Holes Before and After Desmearing>

The comparative example proceeds the desmear process with the insulating layer in the B-stage state, and accordingly, it has a large size difference between the via hole before the desmearing and the via hole after the desmearing. Table 3 shows the difference in size between the via hole before the desmearing and the via hole after the desmearing in the comparative example.

TABLE 3

| Comparative example | Size of the via hole (when the thickness of the insulating layer is 37.5 µm) | | |
|---|---|---|---|
| | Upper width | Lower width | Ratio of the lower width to the upper width |
| Size before desmearing | 50 µm | 35 µm | 70% |
| Size after desmearing | 60 µm | 40 µm | 66% |

As in Table 3 above, in the comparative example, it was confirmed that the size after the desmearing was increased by about 10 µm compared to before the desmearing based on the upper width of the via hole. Accordingly, it was confirmed that the ratio of the lower width to the upper width of the via hole was about 70%.

Table 4 shows the difference in size between the via hole before the desmearing and the via hole after the desmearing in the embodiment.

TABLE 4

| Embodiment | Size of the via hole (when the thickness of the insulating layer is 37.5 µm) | | |
|---|---|---|---|
| | Upper width | Lower width | Ratio of the lower width to the upper width |
| Size before desmearing | 40 µm | 33 µm | 82% |
| Size after desmearing | 45 µm | 36 µm | 80% |

As in Table 4 above, in the embodiment, it was confirmed that the size after the desmearing was increased by about 5 µm based on the upper width of the via hole, which was 50% of the comparative example. Accordingly, it was confirmed that the ratio of the lower width to the upper width of the via hole of the embodiment was 80% or more. Specifically, in the comparative example, the lower width the via hole after the desmearing was found to be 70% or less of the upper width. Also, transmission loss may occur in the via hole due to the difference between the upper width and the lower width of the via hole of the comparative example.

Unlike this, in the embodiment, the lower width of the via hole after the desmearing was 75% to 95% of the upper width. Accordingly, it was possible to minimize the difference between the upper width and the lower width of the via hole according to the embodiment, and thereby minimize the transmission loss of the via. That is, in the embodiment, it was confirmed that the difference between the upper width before the desmearing and the upper width after the desmearing was less than 10 µm based on the upper width of the via hole. For example, it was confirmed that the difference between the upper width before the desmearing and the upper width after the desmearing in the embodiment was 8 µm or less. For example, it was confirmed that the difference between the upper width before the desmearing and the upper width after the desmearing was 5 µm or less.

<Comparison of Surface Roughness of Insulating Layer>

In the comparative example, a desmear process is performed on the insulating layer in a B-stage state to form surface roughness. Unlike this, in the embodiment, a metal layer is laminated on the insulating layer in the B-stage state to form a surface treatment, and then a desmear process is performed on the insulating layer in a C-stage state to form a final surface roughness.

Table 5 shows the change in surface roughness of the insulating layer in the comparative example.

TABLE 5

| Comparative Example | Surface roughness of the insulating layer | |
|---|---|---|
| | Surface | Deviation by position |
| Before Desmearing | 20 nm | 10 nm |
| After Desmearing | 250 nm | 100 nm |

As in Table 5 above, in the comparative example, it was confirmed that the surface roughness Ra of the insulating layer before the desmearing was 20 nm, and a final surface roughness Ra after the desmearing was 250 um. At this time, as shown in (a) of FIG. 10, the comparative example forms surface roughness through the desmear process in the insulating layer in the B-stage state, and accordingly, it was confirmed that the unevenness of the roughness of each position of the surface of the insulating layer was large. For example, it was confirmed that the deviation of roughness of each position of the surface of the insulating layer of the comparative example was about 100 nm based on Ra.

Table 6 shows the change in surface roughness of the insulating layer in the embodiment.

TABLE 5

| Embodiment | Surface roughness of the insulating layer | |
|---|---|---|
| | Surface | Deviation by position |
| Before metal layer lamination | 20 nm | 10 nm |
| After metal layer lamination | 100 nm | 20 nm |
| After Desmearing | 150 nm | 40 nm |

As in Table 6 above, in the embodiment, it was confirmed that the surface roughness Ra of the insulating layer before lamination of the metal layer is 20 nm, the surface roughness Ra after lamination of the metal layer is 100 nm, and a final surface roughness Ra after the desmearing was 150 µm. That is, it was confirmed that the deviation of the surface roughness of each position of the insulating layer of the embodiment was 50 nm or less. For example, as in (b) of FIG. 10, the embodiment proceeds desmear to the insulating layer in the C-stage state, and accordingly, it was confirmed that the deviation of the roughness of each position of the surface of the insulating layer can be significantly reduced compared to the comparative example. For example, it was confirmed that the deviation of the roughness of the surface of the insulating layer of the embodiment was about 40 nm based on Ra, which was 40% of the comparative example.

<Comparison of Surface Roughness of Inner Walls of Via Holes>

Table 7 shows the change in surface roughness of the inner wall of the via hole formed in the insulating layer in the comparative example.

TABLE 7

| Comparative Example | Roughness of inner wall of via hole |
|---|---|
| Before desmearing | 480 nm |
| After desmearing | 300 nm |

As in Table 7 and FIG. 11 above, in the comparative example, it was confirmed that the surface roughness Ra of the via hole before the desmearing was 480 nm, and the final surface roughness Ra after the desmearing was 300 nm. The roughness of the inner wall of the via hole in the comparative example was about 300 nm, and accordingly, it increases the skin effect through the via and causes signal loss.

Table 8 shows changes in surface roughness of the insulating layer in the examples.

TABLE 8

| Embodiment | Roughness of inner wall of via hole |
|---|---|
| Before desmearing | 300 nm |
| After desmearing | 170 nm |

As shown in Table 8 and FIG. 12 above, in the embodiment, it was confirmed that the surface roughness Ra of the via hole before the desmearing was 300 nm and the final surface roughness Ra after the desmearing was 170 nm. The roughness of the inner wall of the via hole in the above embodiment was 170 nm, which is smaller than that of the comparative example, and thus it can minimize signal loss through the via. For example, the final roughness of the inner wall of the via hole according to the embodiment may have Ra between 120 nm and 200 nm. In the embodiment, a uniform surface roughness may be formed on the surface of the insulating layer. Specifically, in the embodiment, a metal layer is laminated on the surface of the insulating layer in a B-stage state, and the surface roughness is imparted to the surface of the insulating layer corresponding to the surface roughness formed on the surface of the metal layer. Accordingly, the embodiment can minimize a deviation in surface roughness formed on the surface of the insulating layer.

In addition, the embodiment may form a fine via hole and a via filling the via hole in the insulating layer. Specifically, the embodiment allows the via hole to be formed in the insulating layer in the C-stage state and allows desmear of the insulating layer in the C-stage state. Accordingly, the embodiment may refine a size of the via hole before the desmearing. In addition, the embodiment may minimize a difference in the size of the via hole after the desmearing compared to the size of the via hole before the desmearing, thereby forming a small diameter via hole.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
   an insulating layer including an upper surface to which a surface roughness (Ra) is imparted; and
   a via electrode disposed in a via hole of the insulating layer,
   wherein the surface roughness (Ra) of the upper surface of the insulating layer satisfies a range of 110 nm to 190 nm,
   wherein a difference between a maximum value and a minimum value of the surface roughness (Ra) imparted to the upper surface of the insulating layer is 40 nm or less,
   wherein the surface roughness (Ra) of the upper surface of the insulating layer satisfies a range of 130 nm to 170 nm,
   wherein a surface roughness (Ra) of a side surface of the via electrode satisfies a range of 120 nm to 200 nm,
   wherein the maximum value is a maximum value of surface roughness (Ra) within a 1 mm*1 mm region of the upper surface of the insulating layer, and
   wherein the minimum value is a minimum value of surface roughness (Ra) within the 1 mm*1 mm region.

2. The circuit board of claim 1, wherein the insulating layer includes via holes passing through upper and lower surfaces of the insulating layer, and wherein a surface roughness (Ra) of an inner wall of the via hole satisfies a range of 120 nm to 200 nm.

3. The circuit board of claim 2, wherein a ratio of a thickness of the insulating layer in a vertical direction to an upper width of the via hole satisfies a range of 63% to 83%.

4. The circuit board of claim 3, wherein the thickness of the insulating layer in the vertical direction satisfies a range of 12.5 μm to 37.5 μm.

5. The circuit board of claim 1, wherein a width of an upper surface of the via electrode is greater than a width of a lower surface of the via electrode, and
    wherein the width of the lower surface of the via electrode is 75% to 95% of the width of the upper surface of the via electrode.

6. The circuit board of claim 5, wherein the width of the lower surface of the via electrode is 80% to 90% of the width of the upper surface of the via electrode.

7. The circuit board of claim 1, wherein the insulating layer includes any one of Ajinomoto Build-up Film (ABF), FR-4, Bismaleimide Triazine (BT), and Photo Imageable Dielectric Resin (PID).

* * * * *